(12) United States Patent
Mizutani

(10) Patent No.: US 7,265,341 B2
(45) Date of Patent: Sep. 4, 2007

(54) SPREAD ILLUMINATING APPARATUS OF SIDE LIGHT TYPE HAVING ELECTRODE PATTERNS

(75) Inventor: Hitoshi Mizutani, Kitasaku-gun (JP)

(73) Assignee: Minebea Co., Ltd., Kitasaku (JP)

( * ) Notice: Subject to any disclaimer, the term of this patent is extended or adjusted under 35 U.S.C. 154(b) by 28 days.

(21) Appl. No.: 11/373,911

(22) Filed: Mar. 14, 2006

(65) Prior Publication Data

US 2006/0219883 A1 Oct. 5, 2006

(30) Foreign Application Priority Data

Mar. 31, 2005 (JP) .............................. 2005-103442

(51) Int. Cl.
*H01J 5/02* (2006.01)
(52) U.S. Cl. .................. 250/239; 250/227.11
(58) Field of Classification Search .............. 250/239, 250/227.11, 227.21, 227.31, 227.32, 216; 362/31, 551–560, 50, 26

See application file for complete search history.

(56) References Cited

U.S. PATENT DOCUMENTS 5,664,862 A * 9/1997 Redmond et al. ........... 362/625

FOREIGN PATENT DOCUMENTS

JP A 9-298008 11/1997

* cited by examiner

*Primary Examiner*—Que T Le
(74) *Attorney, Agent, or Firm*—Oliff & Berridge, PLC

(57) ABSTRACT

There is provided a spread illuminating apparatus including a light guide plate, and an LED structure which is disposed at a side surface of the light guide plate, includes: a substrate having electrode patterns formed thereon; an LED chip disposed on the electrode patterns; and a light-transmittable resin adapted to seal up the LED chip and exposed due to a lamp house not provided therearound, and which has a longitudinal dimension substantially equal to the longitudinal dimension of the side surface of the light guide plate. The electrode patterns are formed so as to cover substantially the entire area of a surface of the substrate. Accordingly, heat generated by the LED chip can be efficiently transmitted and released outside, and also light introduced in the light guide plate is suppressed from leaking out from the side surface of the light guide plate.

6 Claims, 3 Drawing Sheets

SPREAD ILLUMINATING APPARATUS OF SIDE LIGHT TYPE HAVING ELECTRODE PATTERNS

BACKGROUND OF THE INVENTION

1. Field of the Invention

The present invention relates to a spread illuminating apparatus of side light type, and more particularly to a side light type spread illuminating apparatus for use as a lighting means for a liquid crystal display device.

2. Description of the Related Art

Currently, a liquid crystal display (LCD) is extensively used as a display means for various electronic equipments. Since a liquid crystal of an LCD does not emit light by itself, a lighting means is required for achieving visibility when the LCD is used at night or in a dark place. A spread illuminating apparatus has conventionally been used as such a lighting means, and especially, a side light type spread illuminating apparatus is extensively used, which has a light guide plate having transparency, and a linear light source or one or more point light sources disposed at a side surface of the light guide plate. Recently, a spread illuminating apparatus incorporating a point light source, which enables simplification of a driving circuit, is seeing an increased usage in small-size electronic equipments such as mobile information terminals, and a white light emitting diode (hereinafter referred to simply as "LED") is frequently employed as such a point light source.

In order to enhance the brightness for such a side light type spread illuminating apparatus, it is required to increase the luminance of an LED as a primary light source, and also to efficiently utilize light emitted from the LED. For increasing the luminance of the LED, current to drive the LED is raised to increase the amount of light emitted from an LED chip, but this causes the LED chip to generate increased heat so as to raise the ambient temperature consequently lowering the luminous efficiency of the LED chip and shortening the life of the LED chip, and facilitation of heat dissipation is required. On the other hand, the following problem is conventionally involved with regard to the efficient utilization of light emitted from the LED.

FIG. 4 is a top plan view of a conventional side light type spread illuminating apparatus. Referring to FIG. 4, a side light type spread illuminating apparatus 100 includes a light guide plate 101, and an LED 105 disposed at a side surface 102 (hereinafter referred to as "light entrance surface" as appropriate) of the light guide plate 101. In the spread illuminating apparatus 100, light emitted from the LED 105 is introduced in the light guide plate 101 through the light entrance surface 102 and is adapted to exit out uniformly from a major surface 104 while traveling from the light entrance surface 102 toward a side surface 103 opposite to the light entrance surface 102, thus providing function as a lighting means for a liquid crystal panel and the like. However, some light that is reflected at the side surface 103 and gets back to the light entrance surface 102 (such light is referred to as "internal reflection light") leaks out from the light entrance surface 102 so as to take an optical path P1, thus causing loss light.

To deal with the problems described above, a spread illuminating apparatus using LEDs is disclosed (refer to, for example, Japanese Patent Application Laid-Open No. H9-298008; FIGS. 1 and 2 attached therein). FIG. 5 is a front elevation view of an LED structure 200 used in such a spread illuminating apparatus. The LED structure 200 includes a reflection case 201 formed of resin and having a rectangular solid configuration with its rear end blinded and its front end opened, and two LED chips 202 disposed at the blinded rear end of the reflection case 201. The LED structure 200 further includes terminal plates 203, 204 and 205 formed integrally with respective external lead terminals (not shown), and the two LED chips 202 are mounted to the terminal plate 204 by a bonding method, and are connected respectively to the terminal plates 203 and 205 by a wire bonding method. The aforementioned Japanese Patent Application Laid-Open No. H9-298008 describes a spread illuminating apparatus which includes two of the LED structures 200 disposed respectively at two shorter side surfaces of a substantially rectangular light guide plate, wherein the dimension of the reflection case 201 is optimally determined according to the dimension of the shorter side surface of the light guide plate.

Since the spread illuminating apparatus described above includes the terminal plates 203, 204 and 205 having a large area relative to the size of the LED chips 202, and includes the reflection case 201 having its longitudinal dimension measuring optimally up to the longitudinal dimension of the shorter side surface (as light entrance surfaces) of the light guide plate, some degree of favorable effects are anticipated on the above-described problems due to LED chips generating increased heat and due to internal reflection light leaking out from the light entrance surface.

In the LED structure 200 shown in FIG. 5, however, since the LED chips 202 are disposed at the blinded rear end of the reflection case 201 which is formed of resin so as to enclose the terminal plates 203, 204 and 205, the heat generated by the LED chips 202 and transmitted therefrom to the terminal plates 203, 204 and 205 cannot be sufficiently released outside due to the heat transfer resistance of the reflection case 201, though the terminal plates 203, 204 and 205 have a relatively large area for the size of the LED chips 202. Also, the light emitted from the LED chips 202 and the internal reflection light may possibly be absorbed by the reflection case 201 causing loss light, and thus efficient utilization of light emitted from the LED chips 202 cannot be achieved.

SUMMARY OF THE INVENTION

The present invention has been made in light of the above circumstances, and it is an object of the present invention to provide a spread illuminating apparatus, in which the luminance of light emitted by an LED chip is increased, and the light from the LED chip is efficiently utilized, thereby achieving an increased and uniform brightness, and also a lower profile.

In order to achieve the object described above, according to an aspect of the present invention, there is provided a spread illuminating apparatus including a light guide plate, and a light emitting diode (LED) structure which is disposed at a side surface of the light guide plate, and which includes: a substrate having electrode patterns formed thereon; an LED chip disposed on the electrode patterns; and a light-transmittable resin adapted to seal up the LED chip and not having a lamp house provided therearound thus being exposed, wherein the LED structure has a longitudinal dimension substantially equal to the longitudinal dimension of the side surface of the light guide plate facing the LED structure.

Since a lamp house is not provided around the light-transmittable resin, the spread illuminating apparatus can be reduced in thickness, and since light emitted from the LED chip can be efficiently utilized, the brightness for the spread illuminating apparatus can be enhanced. Further, since the longitudinal dimension of the LED structure is substantially equal to the longitudinal dimension of the side surface of the light guide plate facing the LED structure, light introduced into the light guide plate and reflected back at a side surface of the light guide plate opposite to the side surface facing the LED structure is prevented from leaking out from the side surface facing the LED structure, and thus the light from the LED chip is efficiently utilized so as to further enhance the brightness for the spread illuminating apparatus. And loss light due to absorption by an exterior member such as a lamp house is not incurred thus further efficiently utilizing the light from the LED chip.

In the aspect of the present invention, the electrode patterns of the LED structure may be formed so as to cover substantially the entire area of a surface of the substrate. Consequently, heat generated by and radiated from the LED chip is transmitted to the electrode patterns having large areas relative to the size of LED chip and therefore can be efficiently dissipated. And, since the light-transmittable resin to seal up the LED chip is exposed, the heat transmitted to the electrode patterns can be freely released outside.

In the aspect of the present invention, the electrode patterns may be partly exposed where the light-transmittable resin is not provided. Consequently, the heat transmitted to the electrode patterns can be further efficiently released outside.

In the aspect of the present invention, the light-transmittable resin may include a portion having a semi-cylindrical configuration to protrude in the progressing direction of light emitted from the LED chip, and a recess shaped complementary to the configuration of the protrusion may be formed at the side surface of the light guide plate. Consequently, the light emitting surface of the LED structure and the light entrance surface of the light guide plate can be put in a close contact with each other, and also the light emission angle achieved by the LED structure can be maintained through the light guide plate thus providing a uniform illumination for the spread illuminating apparatus.

Thus, a higher luminance of the LED chip and a better utilization efficiency of light from the LED chip can be successfully achieved in the spread illuminating apparatus according to the present invention, thereby enabling increase of brightness with an enhanced uniformity in illumination, and reduction of profile.

DETAILED DESCRIPTION OF THE PREFERRED EMBODIMENTS

Preferred embodiments of the present invention will hereinafter be described with reference to the accompanying drawings. It is noted that FIGS. 1A to 3 are provided for explanation purpose and may not necessarily reflect actual configurations and dimensions.

Figure 1A:
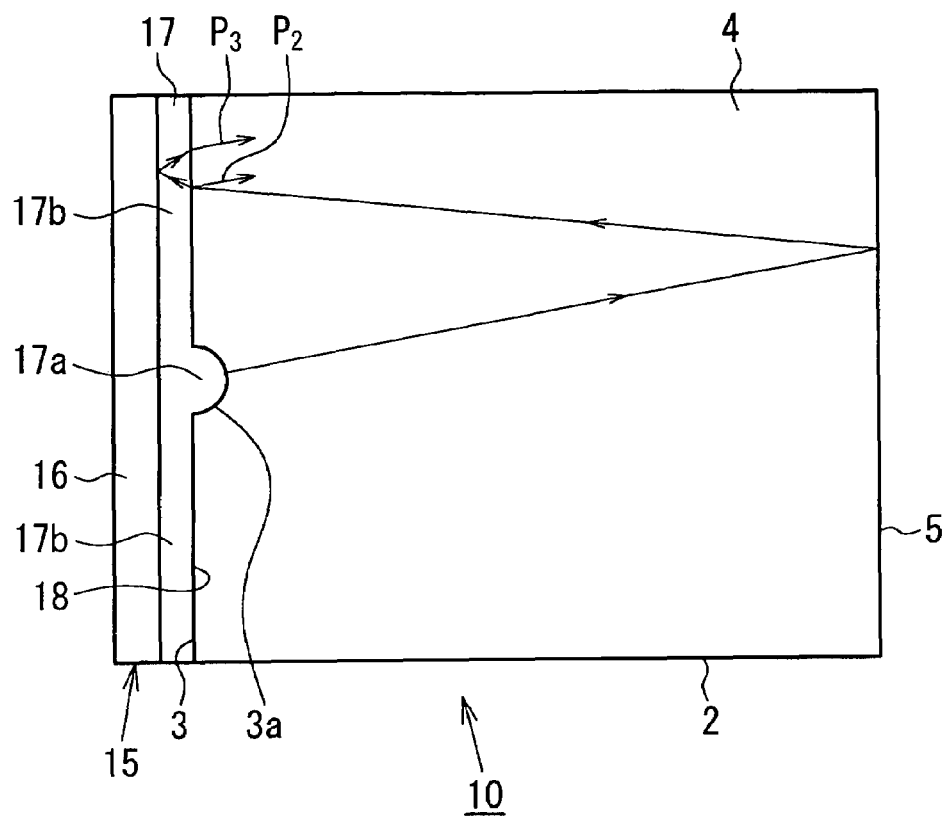
FIG. 1A is a schematic top plan view of a spread illuminating apparatus according to a first embodiment of the present invention.

Referring to FIG. 1A, a spread illuminating apparatus 10 according to a first embodiment of the present invention includes a light guide plate 2, and an LED structure 15 disposed at a side surface (light entrance surface) 3 of the light guide plate 2. The light guide plate 2 is formed, preferably by injection molding, of a light-transmittable resin, for example, acrylic resin, polycarbonate resin, and amorphous polyolefin resin, and a recess 3a shaped complementary to a protrusion 17a (to be described later) in the LED structure 15 is formed at the light entrance surface 3 of the light guide plate 2.

Figure 1B:
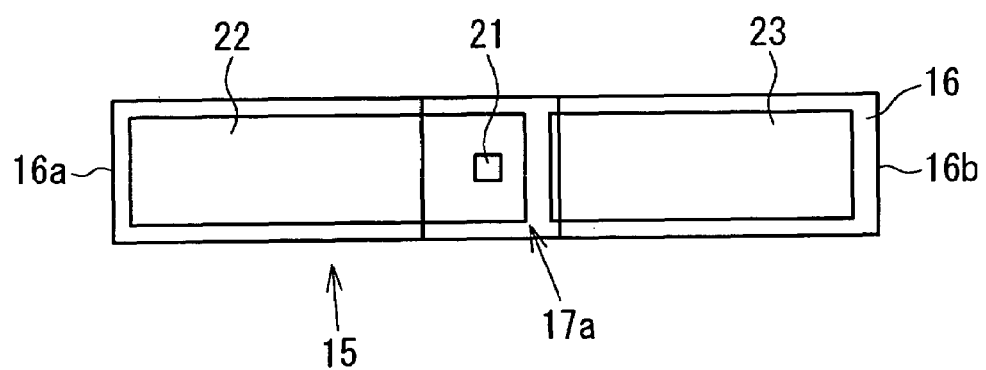
FIG. 1B is a front elevation view of an LED structure used in the spread illuminating apparatus of FIG. 1A.

Referring to FIG. 1B as well as FIG. 1A, the LED structure 15 includes a substrate 16 having electrode patterns 22 and 23 formed thereon, an LED chip 21 mounted on the substrate 16, and a light-transmittable resin 17 to seal up the LED chip 21. The light-transmittable resin 17 includes a base portion 17b having a substantially rectangular solid configuration along the substrate 16 and defining a light emitting surface 18 facing toward the light guide plate 2, and the aforementioned protrusion 17a having a semi-cylindrical configuration protruding from the base portion 17b in the progressing direction of light emitted from the LED chip 21. There is no exterior member, e.g., a lamp house provided around the light-transmittable resin 17, thus allowing the light-transmittable resin 17 to be exposed.

In the LED structure 15, the electrode patterns 22 and 23 are formed of an electrically conductive metal material, for example, Cu foil in such a manner as to cover almost the entire area of a surface of the substrate 16 except areas needing electrical insulation. The electrode patterns 22 and 23 are formed integrally with terminals (not shown) to be connected to a driving circuit for the LED structure 15, or formed separately from terminals and then coupled thereto by an appropriate method, and thus electric power can be duly supplied to drive the LED chip 21. FIG. 1B shows some margin provided outside the electrode patterns 22 and 23 within the substrate 16 for the convenience of explanation, but such margin does not necessarily have to be provided as long as wiring is duly implemented.

The present invention is not limited to any specific connection manner between the LED chip 21 and the electrode patterns 22 and 23. For example, the LED chip 21 may be mounted adhesively on the electrode pattern 22, and an anode electrode and a cathode electrode provided at the top face of the LED chip 21 may be electrically connected to the electrode patterns 22 and 23 via thin metallic wires (e.g., $\phi$=20 µm, not shown) made of gold and the like. Alternatively, an anode electrode (or a cathode electrode) provided at the bottom face of the LED chip 21 may be attached to the electrode pattern 22 by an electrically conductive resin thereby producing an electrical connection while a cathode electrode (or an anode electrode) provided at the top face of the LED chip 21 is connected to the electrode pattern 23 via a thin metallic wire, or the LED chip 21 may be attached to the electrode patterns 22 and 23 by means of so called flip-chip mounting.

The LED structure 15 is preferably constituted by a white LED to emit a white light in a pseudo-manner such that a blue light emitted from an LED chip is mixed with a yellow light emitted from a fluorescent substance to absorb the blue light and to convert into a long-wavelength light, and the light-transmittable resin 17 is structured such that a layer containing a transparent hard silicone resin is disposed around a layer containing hard silicone resin mixed with yttrium aluminum garnet (YAG) molecule which is a fluorescent substance to emit a yellow light, and which is activated by cerium.

The LED structure 15 has a longitudinal dimension substantially equal to the longitudinal dimension of the light entrance surface 3 of the light guide plate 2, preferably has a height substantially equal to the thickness of the light guide plate 2, and is disposed at the light entrance surface 3 with the protrusion 17a engagingly fitting into the recess 3a, so that the light emitting surface 18 of the LED structure 15 totally covers the light entrance surface 3 of the light guide plate 2. With the structure described above, internal reflection light which is reflected at a side surface 5 of the light guide plate 2 opposite to the light entrance surface 3 and falls incident on the light entrance surface 3 is reflected either at the light emitting surface 18 of the LED structure 15 or at the electrode patterns 22 and 23, and is brought back into the light guide plate 2 so as to take optical paths P2 and P3 as shown in FIG. 1A. Consequently, the internal reflection light can be efficiently utilized, without loss light, as illumination light for the spread illuminating apparatus 10. Also, since the LED structure 15 doest not include any exterior member, such as a lamp house, that absorbs light causing loss light, the internal reflection light can be further efficiently brought back into the light guide plate 2.

Further, since the electrode patterns 22 and 23 are formed so as to cover almost the entire area of a surface of the substrate 16 as described above thus defining relatively large areas for the LED chip 21, the heat generated by and radiated from the LED chip 21 is transmitted efficiently to the electrode patterns 22 and 23. And, since the light-transmittable resin 17 sealing up the LED chip 21 is not enclosed with any exterior member, e.g., a lamp house having heat transfer resistance, and therefore is exposed, the heat transmitted from the LED chip 21 to the electrode patterns 22 and 23 can be freely released outside. In this connection, the base portion 17b of the light-transmittable resin 17 is preferably as thin as possible for efficient heat dissipation from the LED structure 15.

Figure 2:
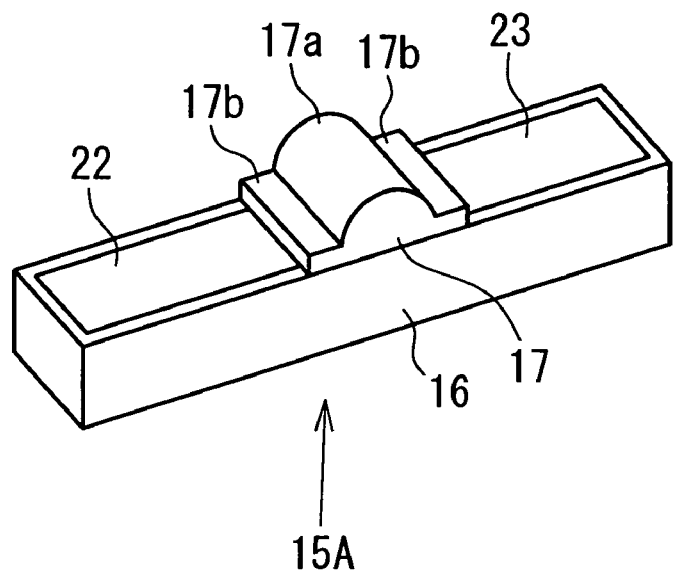
FIG. 2 is a perspective view of an LED structure incorporated in a spread illuminating apparatus according to a second embodiment of the present invention.

Referring now to FIG. 2 relating to a second embodiment of the present invention, an LED structure 15A, which constitutes a spread illuminating apparatus according to the second embodiment, includes a base portion 17b of a light-transmittable resin 17 with its longitudinal dimension reduced so as to expose electrode patterns 22 and 23 except the vicinity of an LED chip 21 (not shown). With this structure, heat transmitted from the LED chip 21 to the electrode patterns 22 and 23 can be further efficiently released outside.

The LED structure 15A may be disposed at a light entrance surface 3 of a light guide plate 2 such that an air gap equivalent to the thickness of the base portion 17b is provided between the light entrance surface 3 and the electrode patterns 22 and 23. Alternatively, either the light entrance surface 3 of the light guide plate 2 may have a recess 3a shaped complementary to the light-transmittable resin 17 shown in FIG. 2, or the light-transmittable resin 17 may be composed of a protrusion 17a only, so that the LED structure 15A is disposed at the light entrance surface 3 of the light guide plate 2 with no air gap provided between the light entrance surface 3 and the electrode patterns 22 and 23. The LED structure 15A should be selectively disposed in any one of the arrangement modes described above in consideration of heat dissipation efficiency and also protection for the electrode patterns 22 and 23.

In the LED structure 15/15A, the amount of light progressing forward and the light emission angle can be adjusted and well balanced by appropriately determining the proportion between the height (protruding dimension) and the cylinder radius of the protrusion 17a of the light-transmittable resin 17, and the light emission angle thus achieved at the LED structure 15/15A can be maintained through the light guide plate 2 by engagingly fitting the protrusion 17a into the recess 3a shaped complementary to the protrusion 17a.

Also, in the LED structure 15/15A, light emitted from the LED chip 21 may possibly exit out from other surfaces than the light emitting surface 18a. In order to fully utilize light from the LED chip 21, a reflection plate may be disposed on the top surface and/or the bottom surface of the LED structure 15/15A. As such a reflection plate, a thin resin plate having thereon a thin metallic film of aluminum, silver, and the like is suitable in terms of thickness dimension and reflection property. The reflection plate may alternatively be constituted by a thin resin plate coated with white or opaque white paint, a thin resin plate formed of resin mixed with white pigment, or a thin metallic plate of highly reflective metal, such as aluminum and silver.

Figure 3:
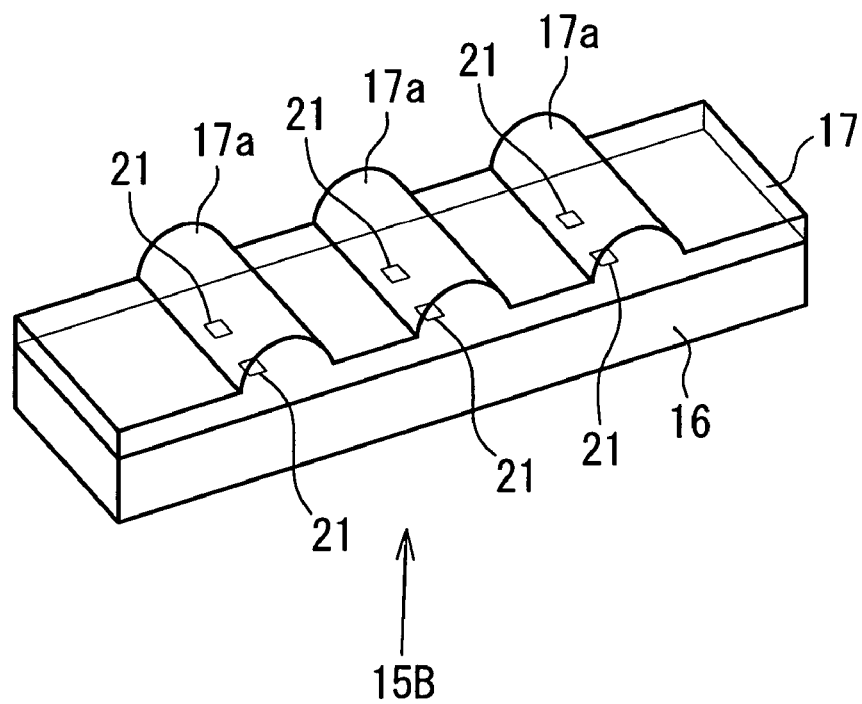
FIG. 3 is a perspective view of an LED structure incorporated in a spread illuminating apparatus according to a third embodiment of the present invention.
Figure 4:
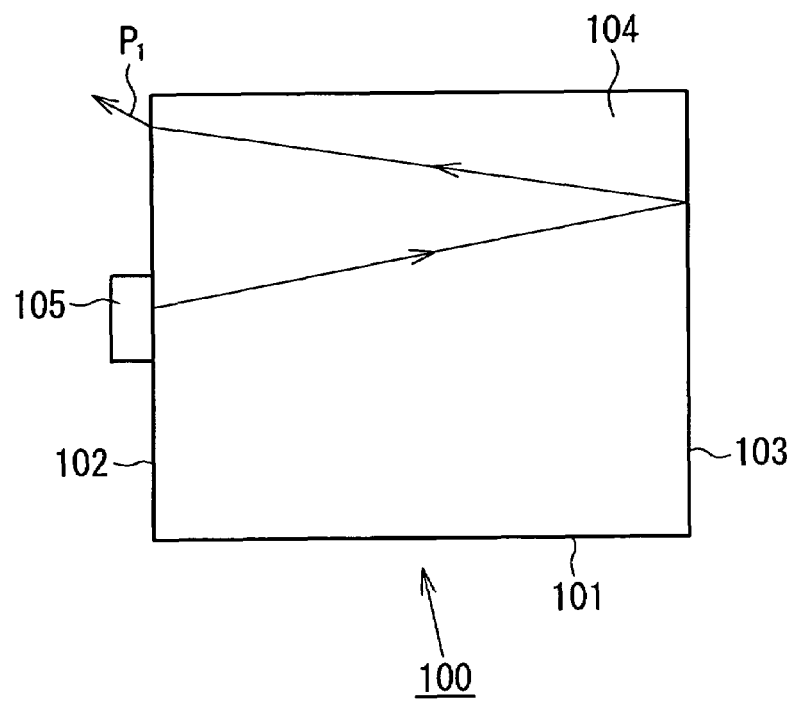
FIG. 4 is a schematic top plan view of a conventional spread illuminating apparatus, explaining a problem of light leaking out.
Figure 5:
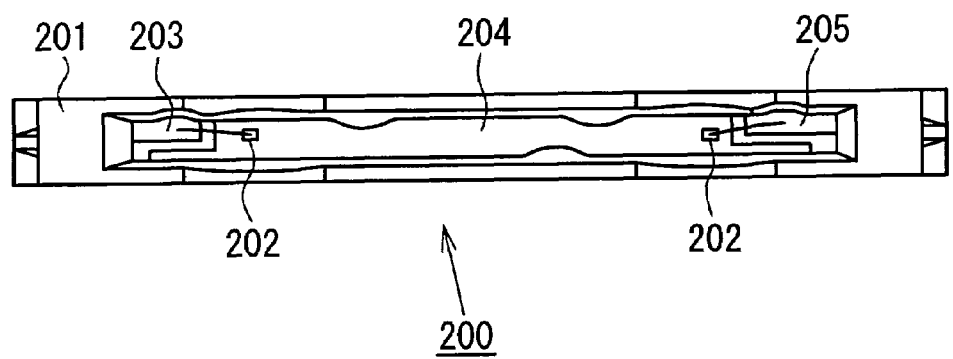
FIG. 5 is a front elevation view of an LED structure used in a conventional spread illuminating apparatus.

Referring to FIG. 3 relating to a third embodiment of the present invention, an LED structure 15B, which constitutes a spread illuminating apparatus according to the third embodiment, includes a plurality (six in the figure) of LED chips 21 disposed on a substrate 16, while only one LED chip 21 is included in the LED structure 15 or 15A described above. The plurality of LED chips 21 may be connected in series, parallel, or combination thereof according to the specification of the driving circuit for the LED structure 15B, and other conditions, and electrode patterns may be appropriately formed according to the connection mode of the LED chips 21.

While the present invention has been illustrated and explained with respect to specific embodiments thereof, it is to be understood that the present invention is by no means limited thereto but encompasses all changes and modifications that will become possible within the scope of the appended claims.

What is claimed is:

1. A spread illuminating apparatus comprising:
   a light guide plate; and
   a light emitting diode (LED) structure which is disposed at a side surface of the light guide plate, and which comprises: a substrate having electrode patterns formed thereon; an LED chip disposed on the electrode patterns; and a light-transmittable resin to seal up the LED chip, the light-transmittable resin omitting provision of a lamp house therearound so as to be exposed, wherein the LED structure has a longitudinal dimension substantially equal to a longitudinal dimension of the side surface of the light guide plate facing the LED structure.

2. A spread illuminating apparatus according to claim 1, wherein the electrode patterns of the LED structure are formed so as to cover substantially an entire area of a surface of the substrate.

3. A spread illuminating apparatus according to claim 2, wherein the electrode patterns are partly exposed where the light-transmittable resin is not provided.

4. A spread illuminating apparatus according to claim 1, wherein the light-transmittable resin comprises a portion having a semi-cylindrical configuration to protrude in a progressing direction of light emitted from the LED chip, and a recess shaped complementary to the configuration of the protrusion is formed at the side surface of the light guide plate.

5. A spread illuminating apparatus according to claim 2, wherein the light-transmittable resin comprises a portion having a semi-cylindrical configuration to protrude in a progressing direction of light emitted from the LED chip, and a recess shaped complementary to the configuration of the protrusion is formed at the side surface of the light guide plate.

6. A spread illuminating apparatus according to claim 3, wherein the light-transmittable resin comprises a portion having a semi-cylindrical configuration to protrude in a progressing direction of light emitted from the LED chip, and a recess shaped complementary to the configuration of the protrusion is formed at the side surface of the light guide plate.

* * * * *